United States Patent
Kuroda (10) Patent No.: US 8,755,217 B2
(45) Date of Patent: Jun. 17, 2014

(54) SEMICONDUCTOR MEMORY DEVICE

(71) Applicant: Panasonic Corporation, Kadoma (JP)

(72) Inventor: Naoki Kuroda, Osaka (JP)

(73) Assignee: Panasonic Corporation, Osaka (JP)

( * ) Notice: Subject to any disclaimer, the term of this patent is extended or adjusted under 35 U.S.C. 154(b) by 21 days.

(21) Appl. No.: 13/656,320

(22) Filed: Oct. 19, 2012

(65) Prior Publication Data

US 2013/0044551 A1 Feb. 21, 2013

Related U.S. Application Data

(63) Continuation of application No. PCT/JP2011/004216, filed on Jul. 26, 2011.

(30) Foreign Application Priority Data

Oct. 1, 2010 (JP) ................................. 2010-223964
Jan. 11, 2011 (JP) ................................. 2011-003176

(51) Int. Cl.

| G11C 7/12 | (2006.01) |
|---|---|
| G11C 7/00 | (2006.01) |
| G11C 7/06 | (2006.01) |
| G11C 11/419 | (2006.01) |
| G11C 8/08 | (2006.01) |
| G11C 11/4091 | (2006.01) |

(52) U.S. Cl.
CPC .. *G11C 8/08* (2013.01); *G11C 7/12* (2013.01); *G11C 11/4091* (2013.01); *G11C 11/419* (2013.01)
USPC ... 365/154; 365/63; 365/189.08; 365/189.11; 365/189.15; 365/203

(58) Field of Classification Search
CPC ........ G11C 8/08; G11C 7/12; G11C 11/4091; G11C 11/419

USPC ......... 365/154, 155, 156, 63, 189.08, 189.11, 365/189.15, 203

See application file for complete search history.

(56) References Cited

U.S. PATENT DOCUMENTS

| 2005/0185477 A1 | 8/2005 | Aoki et al. |
| 2009/0161410 A1* | 6/2009 | Houston ...................... 365/154 |
| 2012/0014173 A1* | 1/2012 | Deng ........................... 365/156 |

FOREIGN PATENT DOCUMENTS

| JP | 2004-071106 A | 3/2004 |
| JP | 2005-275382 A | 10/2005 |
| JP | 2007-004888 A | 1/2007 |
| WO | WO-2008/032549 A1 | 3/2008 |

OTHER PUBLICATIONS

International Search Report issued in International Patent Application No. PCT/JP2011/004216 dated Sep. 13, 2011.

* cited by examiner

*Primary Examiner* — Ly D Pham
(74) *Attorney, Agent, or Firm* — McDermott Will & Emery LLP (57) ABSTRACT

A semiconductor memory device includes a memory cell connected to a read bit line and a pair of write bit lines, and a data amplifier connected to the read bit line. A precharge potential resetting circuit uses a function of generating precharge potentials to the pair of write bit lines based on data of the memory cell amplified by the data amplifier to set the precharge potentials of the non-selected pair of write bit lines to have a potential relationship corresponding to the data stored by the memory cell. As a result, data destruction of the non-selected memory cell during write operation is reduced or prevented, and the speed of operation is increased and the area is reduced.

17 Claims, 10 Drawing Sheets

SEMICONDUCTOR MEMORY DEVICE

CROSS-REFERENCE TO RELATED APPLICATIONS

This is a continuation of PCT International Application PCT/JP2011/004216 filed on Jul. 26, 2011, which claims priority to Japanese Patent Application No. 2010-223964 filed on Oct. 1, 2010 and Japanese Patent Application No. 2011-003176 filed on Jan. 11, 2011. The disclosures of these applications including the specifications, the drawings, and the claims are hereby incorporated by reference in their entirety.

BACKGROUND

The present disclosure relates to semiconductor memory devices, and more particularly, to a semiconductor memory device which achieves high-speed operation while reducing or preventing data destruction in a non-selected memory cell during data write operation.

In conventional static random access memory (SRAM) devices, the further miniaturization of transistors included in a memory cell would increase significant variations in transistor characteristics, disadvantageously leading to destruction of data stored by the memory cell during memory operation.

There is a technique of reducing or preventing data destruction during read operation in which bit lines are provided for write operation and read operation separately. There is also a technique of reducing or preventing data destruction in a non-selected memory cell during write operation in which data read from the non-selected memory cell is written back to the non-selected memory cell (see Japanese Patent Publication No. 2007-4888 and International Publication No. 2008/032549).

There are the following problems with the above conventional technique of reducing or preventing data destruction during write operation in a semiconductor memory device.

Firstly, data which has once been read is written back to a non-selected memory cell during write operation. Therefore, the operation time is longer than that of simple write or read operation, and therefore, the speed of the operation of the SRAM device disadvantageously cannot be increased.

Next, in order to achieve the data write-back operation, a write circuit having a capability similar to that of a write buffer used in conventional write operation is required. Also, the timing of writing back needs to be accurately controlled, and therefore, the number of parts increases, disadvantageously resulting in an increase in the circuit area of the SRAM device.

SUMMARY

The present disclosure describes implementations of a semiconductor memory device which has a function of setting the precharge potential of each of a pair of write bit lines to a potential level corresponding to data of a non-selected memory cell, thereby reducing or preventing data destruction of a memory cell while providing higher-speed operation.

An example semiconductor memory device of the present disclosure includes a memory cell including a data storing circuit configured to store data by a first and a second circuit element, and a circuit including transistors provided to connect the data storing circuit, and a read bit line and a pair of write bit lines, together, a data amplifier connected to the read bit line, and pull-down transistors each connected to a corresponding one of the pair of write bit lines. An output of the data amplifier is connected to the gate electrode of one of the pull-down transistors, and one of the pair of write bit lines is connected to the gate electrode of the other one of the pull-down transistors.

Another example semiconductor memory device of the present disclosure includes a memory cell including a data storing circuit configured to store data by a first and a second circuit element, and a circuit including transistors provided to connect the data storing circuit, and a read bit line and a pair of write bit lines, together, and a data amplifier connected to the read bit line. A function of generating precharge potentials to the pair of write bit lines using data of the memory cell amplified by the data amplifier is used to set precharge potentials of the non-selected pair of write bit lines to have a potential relationship corresponding to data stored by the memory cell.

According to the present disclosure, the function of setting the precharge potentials of the pair of write bit lines to potential levels corresponding to data of a non-selected memory cell is provided, whereby a semiconductor memory device in which data destruction of a memory cell is reduced or prevented can be achieved while the speed of operation is increased and the area is reduced.

DETAILED DESCRIPTION

Embodiments of the present disclosure will be described in detail hereinafter with reference to the accompanying drawings. The same or like parts are indicated by the same reference characters and will not be redundantly described in embodiments and variations described below.

First Embodiment

A semiconductor memory device according to a first embodiment of the present disclosure will be described by way of specific examples with reference to FIGS. 1, 2, 3, and 4.

Figure 1:
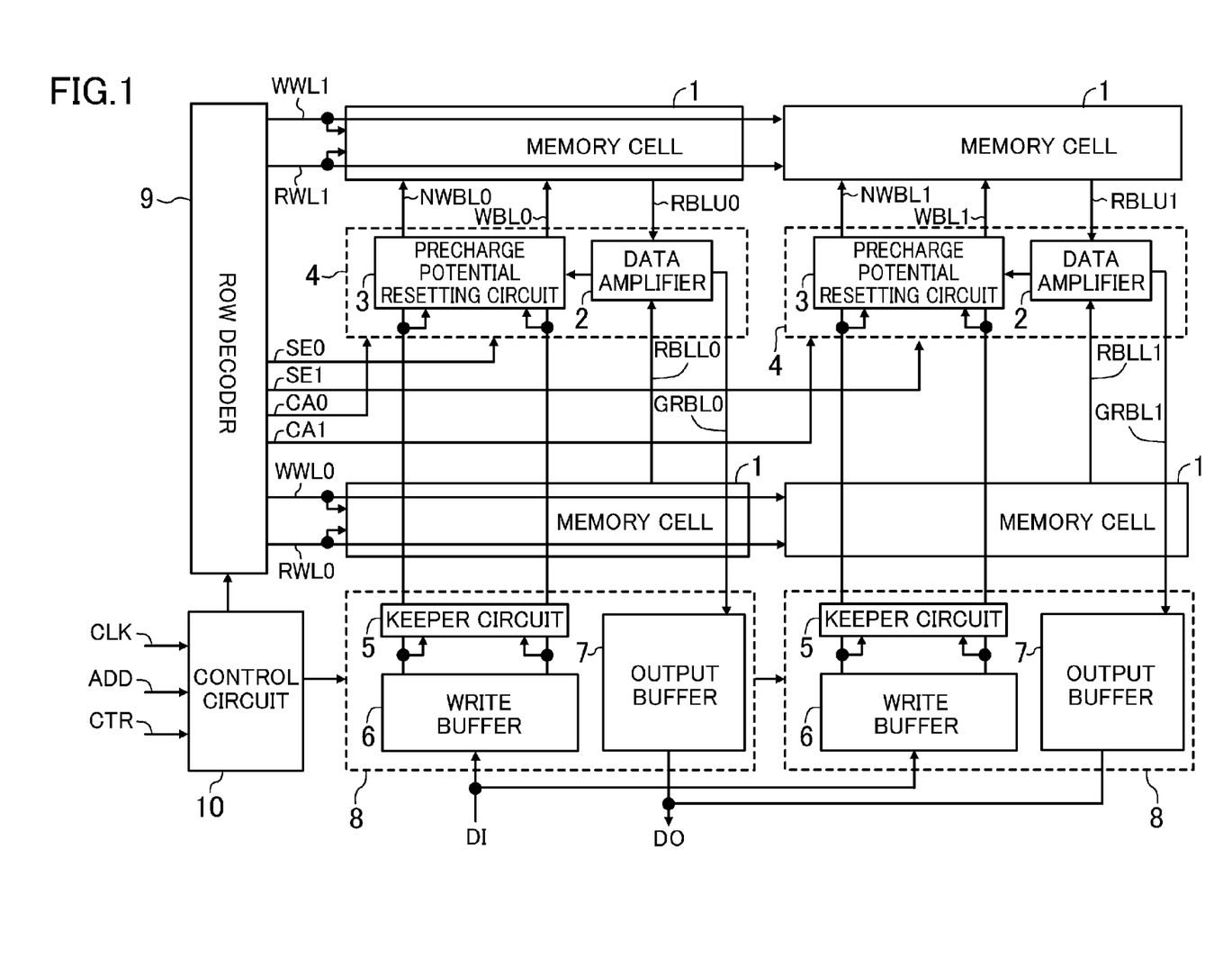
FIG. 1 is a block diagram showing a main configuration of a semiconductor memory device according to a first embodiment of the present disclosure.

The semiconductor memory device of FIG. 1 includes a plurality of memory cells 1 arranged in a matrix, data amplifiers 2 which amplify data on read bit lines RBLU0, RBLL0, RBLU1, and RBLL1 connected to the respective corresponding memory cells 1, precharge potential resetting circuits 3 which have a function of resetting the precharge potentials of a pair of write bit lines WBL0 and NWBL0 and a pair of write bit lines WBL1 and NWBL1 connected to the respective corresponding memory cells 1 using read data, local amplifier circuits 4 which include the data amplifier 2 and the precharge potential resetting circuit 3 and are provided between the memory cells 1, keeper circuits 5 which keep the power supply potential (a VDD level or a high level) of the pair of write bit lines WBL0 and NWBL0 and the pair of write bit lines WBL1 and NWBL1 at a ground potential (a VSS level or a low level), write buffers 6 which transfer input data DI to the pair of write bit lines WBL0 and NWBL0 and the pair of write bit lines WBL1 and NWBL1, output buffers 7 which receive output data lines GRBL0 and GRBL1 from the data amplifiers 2 to drive output data DO, I/F circuits 8 which include the keeper circuit 5, the write buffer 6, and the output buffer 7, a row decoder 9 which generates control signals for write word lines WWL0 and WWL1 and read word lines RWL0 and RWL1 of the memory cells 1 and read control signals SE0 and SE1 and precharge potential resetting control signals CA0 and CA1 which are used as control signals for the local amplifier circuit 4, and a control circuit 10 which receives a clock signal CLK, an address signal ADD, a control signal CTR, etc., and controls the I/F circuits 8, the row decoder 9, etc.

Figure 2:
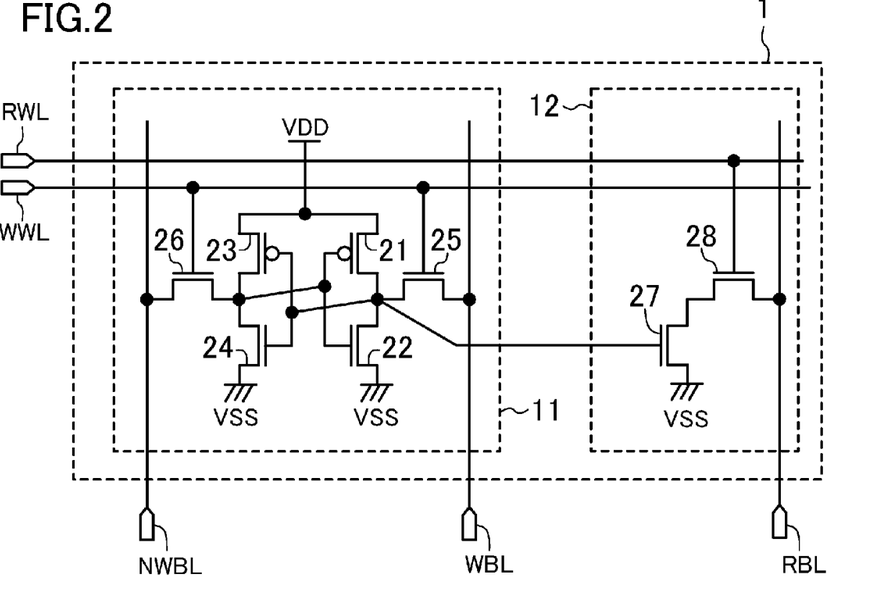
FIG. 2 is a circuit diagram showing a detailed example configuration of a memory cell of FIG. 1.
Figure 3:
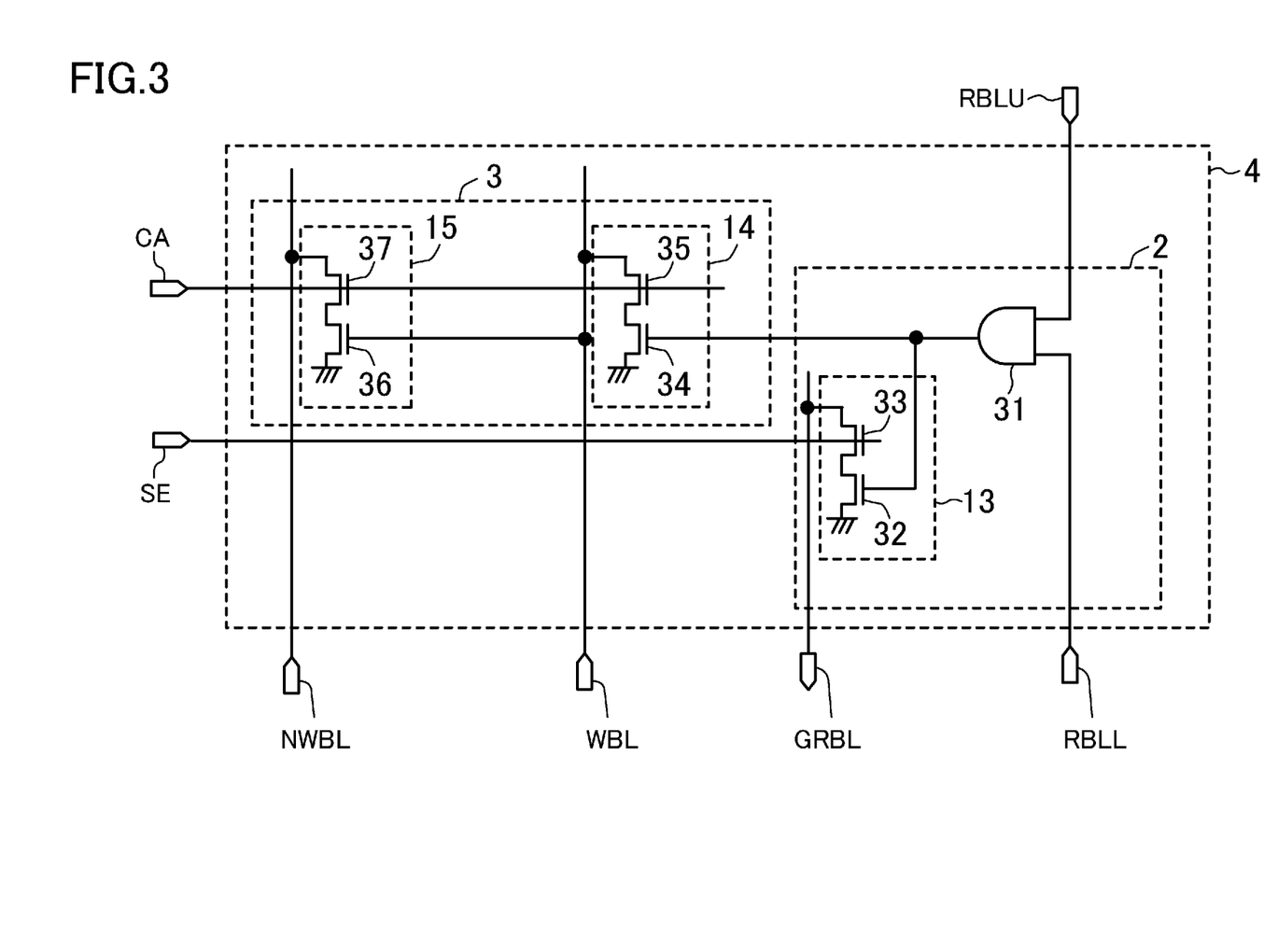
FIG. 3 is a circuit diagram showing a detailed example configuration of a local amplifier circuit of FIG. 1.
Figure 4:
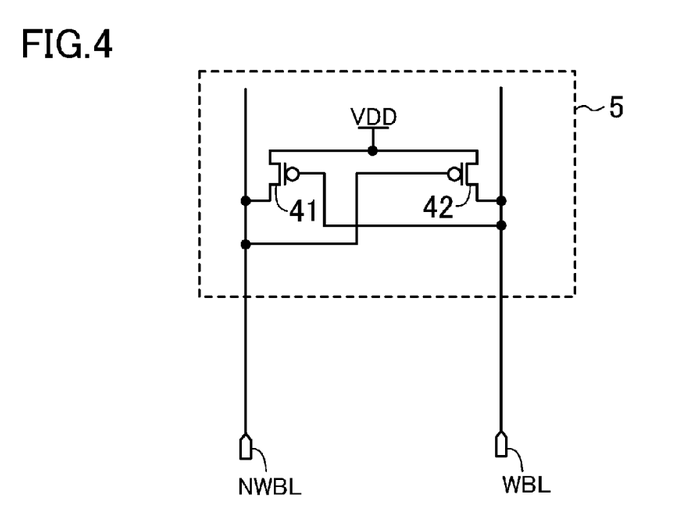
FIG. 4 is a circuit diagram showing a detailed example configuration of a keeper circuit of FIG. 1.

FIGS. 2, 3, and 4 are circuit diagrams showing detailed configurations of the memory cell 1, the local amplifier circuit 4, and the keeper circuit 5 of FIG. 1. Note that in FIGS. 2, 3, and 4, "0" or "1" at the end of the reference character of each of the read bit lines RBLU0, RBLL0, RBLU1, and RBLL1, the pair of write bit lines WBL0 and NWBL0 and the pair of write bit lines WBL1 and NWBL1, the output data lines GRBL0 and GRBL1, the write word lines WWL0 and WWL1, the read word lines RWL0 and RWL1, the read control signals SE0 and SE1, and the precharge potential resetting control signals CA0 and CA1 of FIG. 1, are not shown.

As shown in FIG. 2, the memory cell 1 includes: a data storing circuit 11 including six transistors 21-26 (the transistors 21-24 form two inverters which form a latch circuit, and the two N-channel transistors 25 and 26 are used to control data input from the pair of write bit lines WBL and NWBL to the latch circuit using the write word line WWL); and a data read circuit 12 including two N-channel transistors 27 and 28 connected together in series (the gate electrode of the N-channel transistor 27 is connected to an internal node of the data storing circuit 11, and the gate electrode of the N-channel transistor 28 is used to control data output to the read bit line RBL using the read word line RWL).

As shown in FIG. 3, the local amplifier circuit 4 includes: a data amplifier 2 including a single-end amplifier including an AND circuit 31 which receives, as two inputs, signals on the two read bit lines RBLU and RBLL, and a data transfer control circuit 13 in which two N-channel transistors 32 and 33 are connected together in series, the gate electrode of the N-channel transistor 33 is controlled based on the read control signal SE, and the N-channel transistor 32 is used to control data transfer to the output data line GRBL based on the output signal of the AND circuit 31; a first precharge potential resetting circuit 14 in which two N-channel transistors 34 and 35 are connected together in series, the gate electrode of the N-channel transistor 34 is controlled based on the output signal of the AND circuit 31, and the gate electrode of the N-channel transistor 35 is controlled based on the precharge potential resetting control signal CA and is connected to the first write bit line WBL; and a second precharge potential resetting circuit 15 in which two N-channel transistors 36 and 37 are connected together in series, the gate electrode of the N-channel transistor 36 is controlled using the first write bit line WBL, and the gate electrode of the other N-channel transistor 37 is controlled based on the precharge potential resetting control signal CA and is connected to the second write bit line NWBL.

As shown in FIG. 4, the keeper circuit 5 includes two P-channel transistors 41 and 42. The gate and drain electrodes of the P-channel transistor 41 are connected to the first and second write bit lines WBL and NWBL, respectively. The gate and drain electrodes of the P-channel transistor 42 are connected to the second and first write bit lines NWBL and WBL, respectively. The source electrodes of the P-channel transistors 41 and 42 are connected to the power supply potential (the VDD level or the high level).

Write operation and read operation of the semiconductor memory device thus configured will be described with reference to a timing chart of FIG. 5. Note that it is assumed that write operation is completed during one cycle (from time TA to time TB) of the clock signal CLK, and read operation is completed during one cycle (from time IB to time TC) of the clock signal CLK.

Firstly, write operation, particularly, control operation during write operation of the non-selected memory cell 1 during write operation, specifically, the non-selected memory cell 1 connected to the selected write word line WWL, i.e., the memory cell 1 for which data is not written to the pair of write bit lines WBL and NWBL, will be described because the present disclosure is intended to reduce or prevent data destruction in the non-selected memory cell 1.

Initially, before time TA, the semiconductor memory device is in the standby state, and therefore, the pair of write bit lines WBL0 and NWBL0 and the pair of write bit lines WBL1 and NWBL1 are precharged to a precharge potential, i.e., the power supply potential (the VDD potential or the high level).

Next, when a write command indicating write operation is input at time TA, the read word line RWL0 connected to the data read circuit 12 in the memory cell 1 is activated. At this time, the memory cell 1 connected to the pair of write bit lines WBL0 and NWBL0 is not selected, and therefore, in this memory cell, data destruction should be prevented. By the activation of the read word line RWL0, data is transferred to the read bit lines RBLL0 and RBLL1. Note that, in this case, data on the read bit line RBLL1 is not involved with the operation of the present disclosure and therefore will not be described. If the data stored by the non-selected memory cell 1 is at the high level, low-level data is transferred to the read bit line RBLL0 and is amplified by the AND circuit 31 in the local amplifier circuit 4, and the resulting data (low-level signal) is transferred to the first precharge potential resetting circuit 14. Next, only CA0 of the precharge potential resetting control signals CA0 and CA1 is activated, and the first precharge potential resetting circuit 14 is not activated by the low-level signal, and therefore, the first write bit line WBL0 is kept at the precharge potential (the VDD level or the high level). The high-level first write bit line WBL0 activates the second precharge potential resetting circuit 15, so that the second write bit line NWBL0 is caused to be at the low level. By this operation, the pair of write bit lines WBL0 and NWBL0 are reset to have the same potential relationship as that of high-level data stored by the non-selected memory cell 1 (i.e., of the pair of write bit lines WBL0 and NWBL0, the first write bit line WBL0 is reset to the high-level precharge potential, and the second write bit line NWBL0 is reset to the low-level precharge potential). At this time, as can be seen from FIG. 5, the second write bit line NWBL0 is not pulled down to the ground potential. Specifically, the high- and low-level precharge potentials to which the pair of write bit lines WBL0 and NWBL0 are reset are not limited to the VDD potential and the ground potential which are described as logical value levels, and the higher one of the potential levels of the pair of complementary write bit lines WBL0 and NWBL0 may, of course, be defined as a high level, or the lower one may, of course, be defined as a low level. The effectiveness of this function is supported by the fact that an improvement in static noise margin (SNM) of the memory cell 1, i.e., reduction or prevention of data destruction, is dramatically improved only by providing a potential difference having a relationship depending on data storing the potentials of the pair of bit lines.

Next, the write word line WWL0 is activated. The timing can be caused to be the same as that of the read word line RWL0. This is because the main purpose is not the write-back operation to the non-selected memory cell 1, and the precharge potentials of the pair of write bit lines WBL0 and NWBL0 are reset to have the same potential relationship as that of data stored by the non-selected memory cell 1. In other words, the high and low levels of the pair of write bit lines WBL0 and NWBL0 may not be sufficiently close to the power supply potential and the ground potential, respectively, and therefore, it is not necessary to provide as long a timing margin as that of the conventional art in which the write word line WWL0 is activated after a sufficient time has elapsed since the activation of the read word line RWL0. On the other hand, in order to reduce or prevent data destruction caused by the lack of the SNM of the non-selected memory cell 1, the write word line WWL0 is, of course, preferably activated after the pair of write bit lines WBL0 and NWBL0 have been reset to the precharge potential. The write word line WWL0 may, of course, be activated at a timing slightly later than the activation of the read word line RWL0. Also, at the same time, data is transferred from the input data DI via the write buffer 6 to the pair of write bit lines WBL1 and NWBL1 connected to the selected memory cell 1 as in normal write operation, so that write operation to the desired memory cell 1 is completed.

Next, when a read command indicating read operation is input at time TB, only the read word line RWL0 connected to the data read circuit 12 in the memory cell 1 is activated. By the activation of the read word line RWL0, read data is transferred to the read bit lines RBLL0 and RBLL1. Next, the data amplifier 2 in the local amplifier circuit 4 receives the activated read control signal SE0 from the row decoder 9, and transfers data on the read bit line RBLL0 to the output data line GRBL0. The output buffer 7 outputs data DO1 to a data output DO. At the same time, the read bit line RBLL1 is in the non-selected state, and therefore, data is not read to the output data line GRBL1. Because this operation is read operation, the precharge potential resetting control signals CA0 and CA1 are not activated.

As described above, data stored by the non-selected memory cell 1 is read out during write operation, and the precharge potentials of the pair of write bit lines WBL and NWBL are reset to have a potential relationship corresponding to that data, whereby the SNM of the memory cell 1 can be dramatically improved, and therefore, data destruction can be reduced or prevented. Compared to the write-back operation that read data is written back, the precharge potential is only reset, and therefore, it is not necessary to provide a sufficient timing interval between the activation of the read word line RWL and the activation of the write word line WWL, whereby write operation can be achieved without a delay. Also, this circuit block is provided in the local amplifier circuit 4 provided at a boundary region between the memory cells 1, and the data amplifier 2 which is used during read operation is used, whereby the precharge potential reset operation can be achieved with higher speed and smaller area, compared to the conventional operation that data is once read to a peripheral circuit and then written back.

Note that, in the present disclosure, when a sufficient write time is provided during write operation according to the specifications, the precharge potential reset operation is, of course, equivalent to data rewrite operation to the pair of write bit lines WBL and NWBL, i.e., the write-back operation that the potential level of one of the pair of write bit lines WBL and NWBL is the VDD potential and the potential level of the other bit line is the ground potential. Because of the technique of using the write bit line WBL to control the gate electrode of the N-channel transistor 36 in the second precharge potential resetting circuit 15, it is not necessary to decode read logical value data, i.e., it is not necessary to add a logic gate. Therefore, in particular, the area can be effectively reduced by providing the second precharge potential resetting circuit 15, for example, in the local amplifier circuit 4 in which an increase in the number of elements causes the area overhead.

Here, for ease of understanding of the present disclosure, the memory cell 1 includes a total of eight transistors in the data storing circuit 11 and the data read circuit 12. Alternatively, a memory cell having a different configuration may be used. For example, a conventional memory cell which includes only the data storing circuit 11, i.e., six transistors, may be used. In this case, the precharge potential resetting function may, of course, be effective. In addition, a differential amplifier may be used instead of the single-end amplifier used in the data amplifier 2.

A size (e.g., the channel length, etc.) of the N-channel transistor 34 in the first precharge potential resetting circuit 14 is larger than that of the N-channel transistor 36 in the second precharge potential resetting circuit 15. In other words, the transistor performance of the first precharge potential resetting circuit 14 is greater than that of the second precharge potential resetting circuit 15.

Thus, the transistor size of the pull-down transistor 34 is larger than that of the pull-down transistor 36, i.e., the transistor performance of the first precharge potential resetting circuit 14 which is directly activated by the read data signal is enhanced. Therefore, when the data of the data amplifier 2 is at the high level (the VDD potential or the power supply potential), then if the precharge potential resetting control signal CA is activated because the precharge potentials of the pair of write bit lines WBL and NWBL are at the high level (VDD potential), the first write bit line WBL can be caused to be at the low level before the second write bit line NWBL is caused to be at the low level. As a result, the N-channel transistor 36 whose gate electrode is connected to the first write bit line WBL, in the second precharge potential resetting circuit 15, can be caused to be inactive, and therefore, the first write bit line WBL is not reset to an incorrect precharge potential.

Note that the transistor performance of the first precharge potential resetting circuit 14 is greater than that of the second precharge potential resetting circuit 15. Alternatively, the transistor size (e.g., the channel length or the channel width, etc.) of the second precharge potential resetting circuit 15 may be sufficiently reduced. In this case, it is, of course, sufficient if the capability of resetting the precharge potential within a predetermined time is provided.

As shown in FIG. 3, the N-channel pull-down transistors 34 and 36 in the first and second precharge potential resetting circuits 14 and 15, and the N-channel transistors 35 and 37 connected together in series between the pair of write bit lines WBL and NWBL, are provided. The gate electrodes of the N-channel transistors 35 and 37 are connected to the output signal (i.e., the precharge potential resetting control signal CA) of the write control circuit. As a result, unintended pull-down operation (erroneous operation) of the second write bit line NWBL which may occur every time the second write bit line NWBL is precharged, can be reduced or prevented.

Note that the first and second precharge potential resetting circuits 14 and 15 include the N-channel transistors 35 and 37 which are controlled based on the precharge potential resetting control signal CA. By changing the control signal to the gate electrodes of the N-channel transistors 35 and 37 to one which is produced, taking into consideration the logic of the precharge potential resetting control signal CA, the two N-channel transistors connected together in series can, of course, be replaced with a single N-channel transistor. Alternatively, the pair of write bit lines WBL and NWBL may be precharged to the low level (the ground potential or the VSS potential) instead of the high level (the VDD potential or the power supply potential), and only the pair of write bit lines WBL and NWBL connected to the non-selected memory cell 1 may be precharged to the high level after the activation of the precharge potential resetting control signal CA (a technique of decoding the precharge of the pair of write bit lines WBL and NWBL). In this case, the two N-channel transistors connected together in series can, of course, also be replaced with a single N-channel transistor. Note that because it is assumed that the precharge potentials of the pair of write bit lines WBL and NWBL are at the high level, the first and second precharge potential resetting circuits 14 and 15 include the N-channel transistors 34-37. If the precharge potentials of the pair of write bit lines WBL and NWBL are at the low level (the ground potential or the VSS potential), the first and second precharge potential resetting circuits 14 and 15 may, of course, include P-channel transistors.

The output signal (i.e., the precharge potential resetting control signal CA) of the write control circuit is provided in the same direction in which the read word line RWL and the write word line WWL are arranged in the memory cell 1. As a result, in particular, when the local amplifier circuit 4 is provided, the local amplifier circuit 4 is more efficiently arranged than when the control signal is provided in the bit line direction, and therefore, the area overhead is effectively reduced.

The N-channel transistors 35 and 37 and the N-channel pull-down transistors 34 and 36 connected together in series in the first and second precharge potential resetting circuits 14 and 15, respectively, have the same transistor size. As a result, the same pull-down performance can be provided, advantageously resulting in a decrease in the influence of variations in transistors etc.

The transistor sizes (i.e., transistor performance) of the N-channel pull-down transistors 34 and 36 of the first and second precharge potential resetting circuits 14 and 15 are smaller than the buffer size of the write buffer 6 connected to the pair of write bit lines WBL and NWBL. By sufficiently reducing the transistor performance of the first and second precharge potential resetting circuits 14 and 15 which are only required to have a capability of resetting the precharge of the pair of write bit lines WBL and NWBL, the area overhead in the local amplifier circuit 4 can be reduced.

For the pair of write bit lines WBL and NWBL, the keeper circuit 5 of FIG. 4 including the two P-channel transistors 41 and 42 is provided. As a result, if erroneous operation occurs in the first and second precharge potential resetting circuits 14 and 15 which have only the pull-down function, i.e., high-level data (the VDD potential or the power supply potential) changes to low-level data, the low-level data can be pulled up to high-level data by one of the pull-up P-channel transistors 41 and 42. When the write buffer 6 includes only N-channel transistors, i.e., has only the pull-down function, the keeper circuit 5 also has a function of assisting write operation, resulting stable operation and a reduction in area overhead.

The control circuits including the pull-down transistors 34 and 36 and the N-channel transistors 35 and 37, respectively, i.e., the first and second precharge potential resetting circuits 14 and 15, are provided in the same region in which the data amplifier 2 is provided, and this region is each of one or more boundary regions between the memory cells 1 which are provided in the memory array. Specifically, as in the local amplifier circuit 4, by providing the control circuit at the boundary between the memory cell arrays, a physical distance from the non-selected memory cell 1 targeted by the present disclosure is short compared to a write-back circuit provided in a peripheral circuit, whereby precharge potential reset operation can be performed on the pair of write bit lines WBL and NWBL at higher speed. Note that if the local amplifier circuit 4 is provided only in the I/F circuit 8, the present disclosure is, of course, also effective compared to the write-back operation.

The output signal of the write control circuit from the row decoder 9 is used to activate the address signal which indicates the pair of write bit lines WBL and NWBL for which write operation is masked. Specifically, when a mask function is added to write operation to the selected memory cell 1 connected to the pair of write bit lines WBL1 and NWBL1 of FIG. 5, i.e., write operation is selectively masked, the target address (i.e., the precharge potential resetting control signal CA1) is activated to reset the precharge of the pair of write bit lines WBL1 and NWBL1. As a result, the SNM of the non-selected memory cell 1 masked during write operation can be improved.

First Variation of First Embodiment

Figure 6:
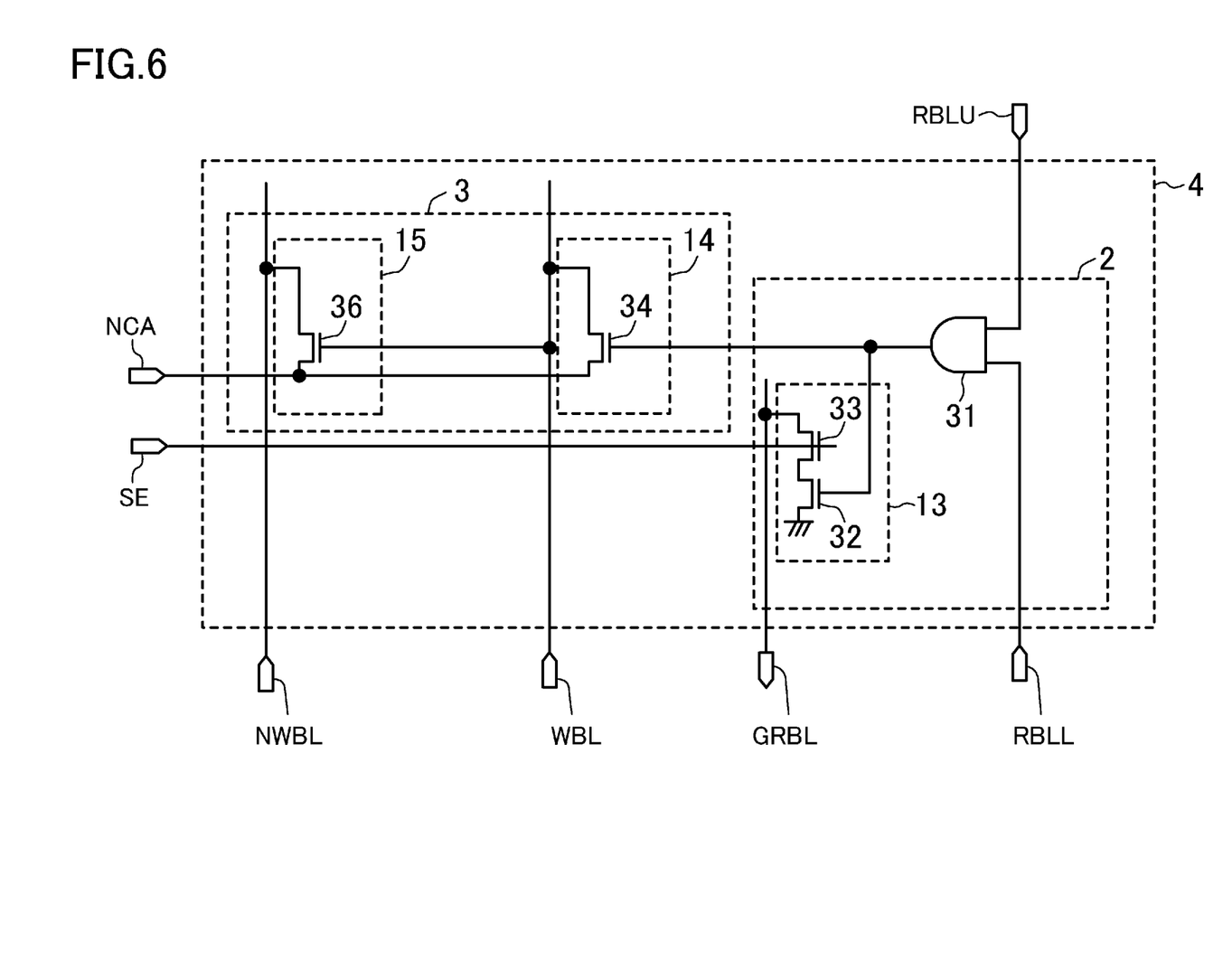
FIG. 6 is a circuit diagram showing a detailed example configuration of a local amplifier circuit in a first variation of the first embodiment of the present disclosure.

A first variation of the first embodiment of the present disclosure has the same basic form and advantages as those of the first embodiment. The first variation of the first embodiment will be described with reference to a circuit diagram shown in FIG. 6. A semiconductor memory device shown in FIG. 6 is the same as that shown in the circuit diagram of FIG. 3, except that the N-channel transistors 35 and 37 are removed, and the source potentials of the N-channel pull-down transistors 34 and 36 are changed from the VSS potential (or the ground potential) to a signal line NCA. Specifically, the first and second precharge potential resetting circuits 14 and 15 each include a single N-channel transistor 34 or 36, respectively. Note that, in FIG. 6, similar to FIG. 3, "0" or "1" at the end of the reference character of each of signal lines and signals is not shown.

Figure 5:
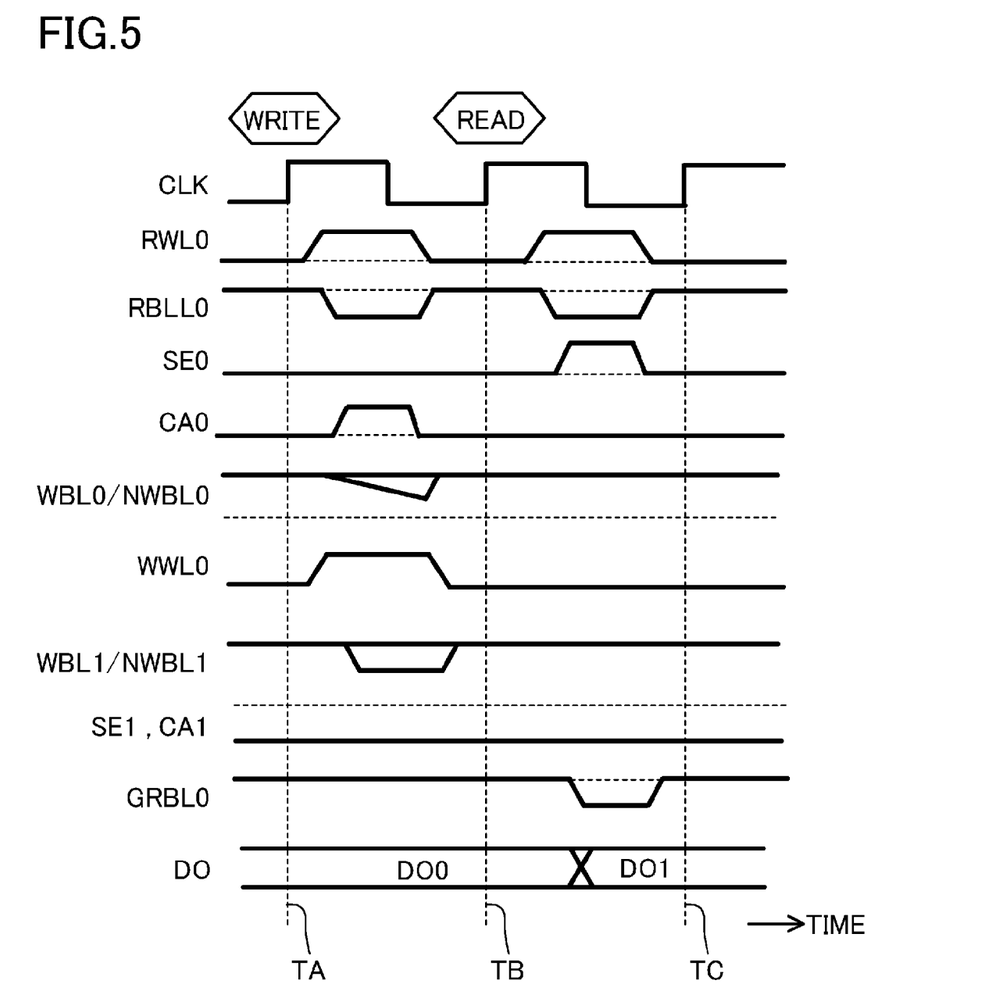
FIG. 5 is a timing chart showing main operation of the semiconductor memory device of the first embodiment of the present disclosure.
Figure 7:
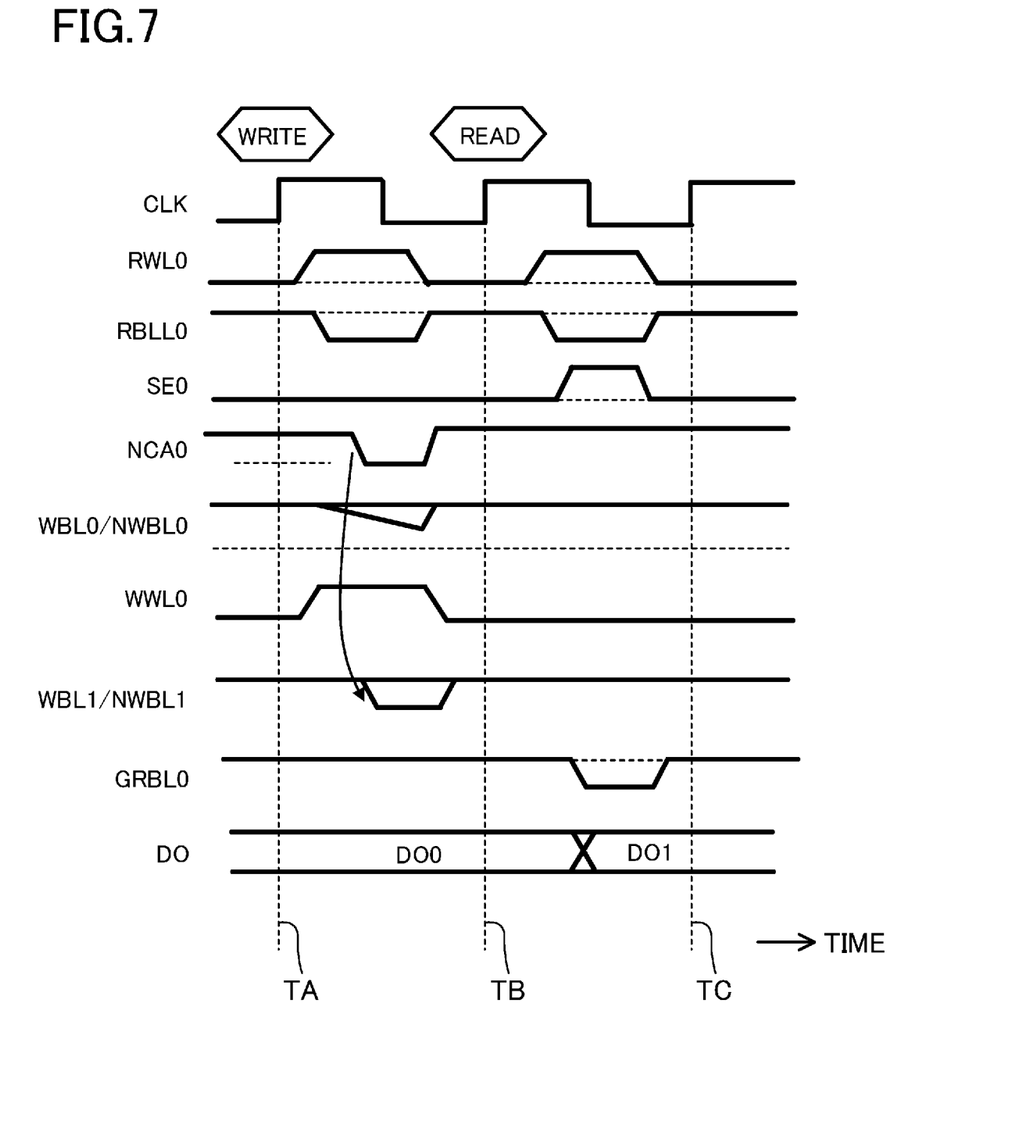
FIG. 7 is a timing chart showing main operation of the semiconductor memory device of the first variation of the first embodiment of the present disclosure.

FIG. 7 shows a timing chart of selection operation during write operation of the semiconductor memory device thus configured, which is the same as that of FIG. 5, except that the logical value of the precharge potential resetting control signal CA is inverted (the inverted version of the precharge potential resetting control signal CA is the signal NCA).

As described above, the N-channel transistors 35 and 37 are removed, and the source potentials of the N-channel pull-down transistors 34 and 36 are changed from the VSS potential (or the ground potential) to the signal line NCA, whereby, in addition to the advantages of the first embodiment, the number of transistors in the local amplifier circuit 4 can be reduced, and therefore, the area can be effectively reduced.

If a control circuit for the signal line NCA is provided in the row decoder 9, a region in the row decoder 9 which is originally a dead space corresponding to the local amplifier circuit 4 can be effectively used, whereby circuit operation can be advantageously easily achieved without a large area overhead.

In the above description, the control circuit for the signal NCA is provided in the row decoder 9. Alternatively, the control circuit for the signal NCA may, of course, be provided in the I/F circuit 8.

Second Variation of First Embodiment

Figure 8:
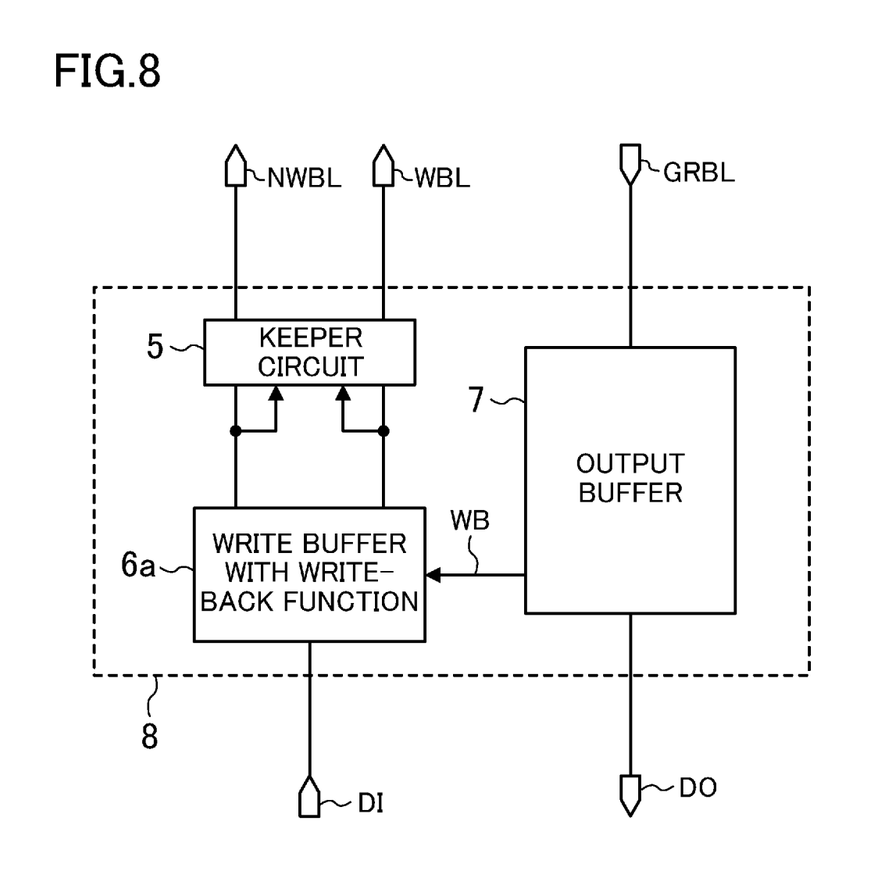
FIG. 8 is a circuit diagram showing a detailed example configuration of an OF circuit in a second variation of the first embodiment of the present disclosure.

A second variation of the first embodiment of the present disclosure has the same basic form and advantages as those of the first embodiment. The second variation of the first embodiment will be described hereinafter with reference to a block diagram shown in FIG. 8. The semiconductor memory device of FIG. 8 is the same as that of FIG. 1, except that the write buffer 6 is replaced with a write buffer 6a having a write-back function, and write-back data WB corresponding to the data output signal DO is input from the output buffer 7 to the write buffer 6a. Note that, in FIG. 8, similar to FIGS. 2-4 and 6, "0" or "1" at the end of the reference character of each of signal lines and signals is not shown.

Figure 9:
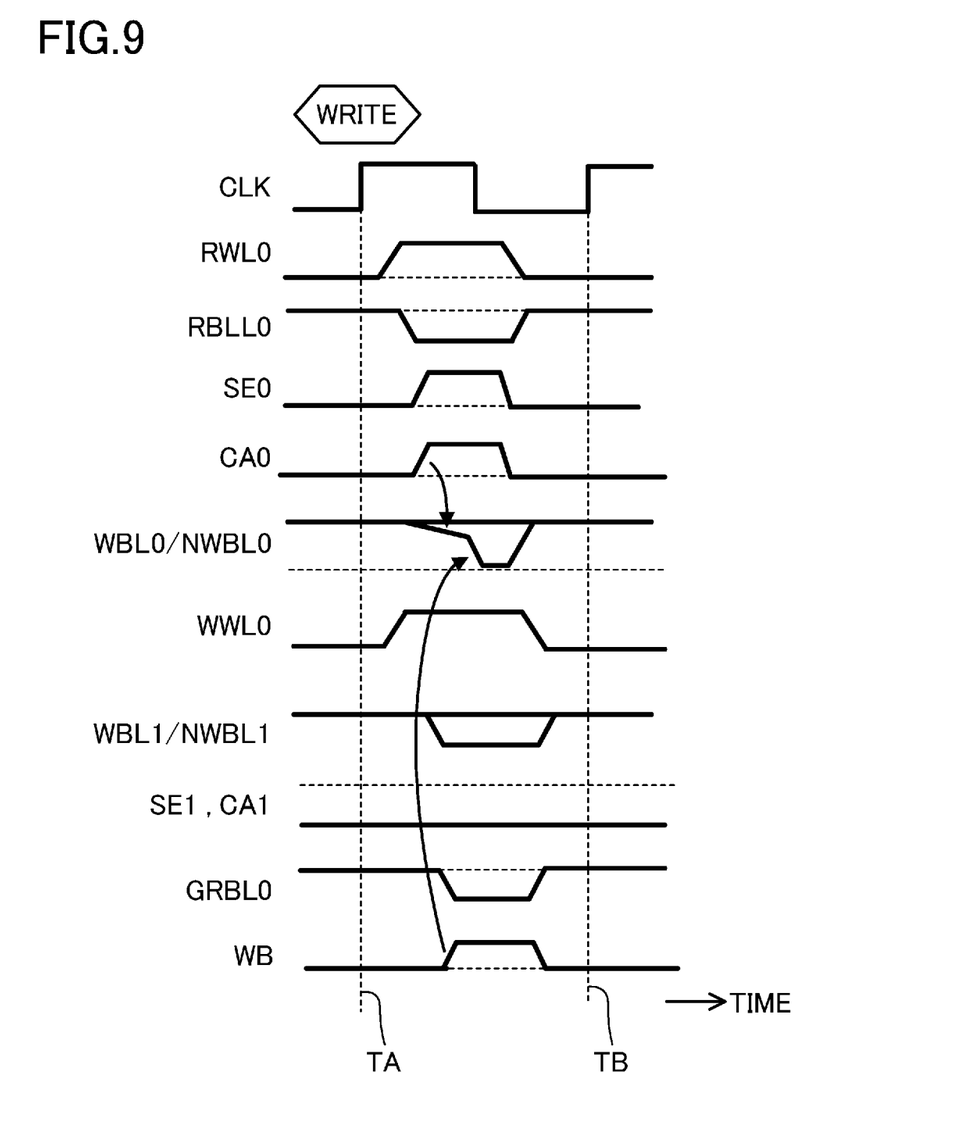
FIG. 9 is a timing chart showing main operation of a semiconductor memory device according to the second variation of the first embodiment of the present disclosure.

Control operation of the non-selected memory cell 1 during write operation of the semiconductor memory device thus configured will be mainly described with reference to FIG. 9. Initially, when a write command is input at time TA, the read word line RWL0 is activated, so that data stored by the non-selected memory cell 1 is read out, and the precharge potentials of the pair of write bit lines WBL0 and NWBL0 are reset to have a potential relationship corresponding to the data. This operation is similar to that described with reference to FIG. 3.

Next, when the write word line WWL0 is activated, the data amplifier 2 transfers data of the non-selected memory cell 1 to the output data line GRBL0 because the read control signal SE0 is activated. By using the write-back data WB which is obtained by amplifying this signal with the output buffer 7, data is written by the write buffer 6a, i.e., write-back operation is performed. At the same time, as in normal write operation, data is transferred from the input data DI via the write buffer 6a to the pair of write bit lines WBL1 and NWBL1 connected to the selected memory cell 1. Thus, write operation to the desired memory cell 1 is completed.

As described above, during write operation, data stored by the non-selected memory cell 1 is read out, and the precharge potentials of the pair of write bit lines WBL and NWBL are reset to have a potential relationship corresponding to the data, and thereafter, the write buffer 6a is used to write back data, whereby the SNM of the memory cell 1 is dramatically improved, and therefore, data destruction can be reduced or prevented. Compared to a semiconductor memory device which has only write-back operation of writing back read data, a defective SNM immediately after activation of a word line can be improved by resetting the precharge potential immediately after activation of a selected word line. In addition, by subsequently performing write-back operation, data can be reliably restored, whereby the SNM can be effectively improved.

Note that the sizes of the N-channel pull-down transistors 34 and 36 in the precharge potential resetting circuit 3 are smaller than that of the N-channel transistor in the write buffer 6a, i.e., the transistor performance is smaller. Because the sizes of the N-channel pull-down transistors 34 and 36 in the precharge potential resetting circuit 3 are thus smaller than that of the N-channel transistor in the write buffer 6a, the drive performance of the N-channel pull-down transistors 34 and 36 in the precharge potential resetting circuit 3 which is placed close to the selected memory cell 1, i.e., whose interconnect load seems to be small, is reduced, whereby erroneous operation of data restoration is reduced or prevented, and the size of the local amplifier circuit 4 can be reduced, and therefore, the area can be efficiently reduced.

After one of the N-channel pull-down transistors 34 and 36 in the precharge potential resetting circuit 3 is activated, the N-channel transistor in the write buffer 6a is activated, i.e., after data is written back to a predetermined potential level using a driver having lower drive performance, the data is written back directly to the desired potential level using a driver having higher drive performance, whereby error in data restore operation or peak current can be reduced.

Second Embodiment

Figure 10:
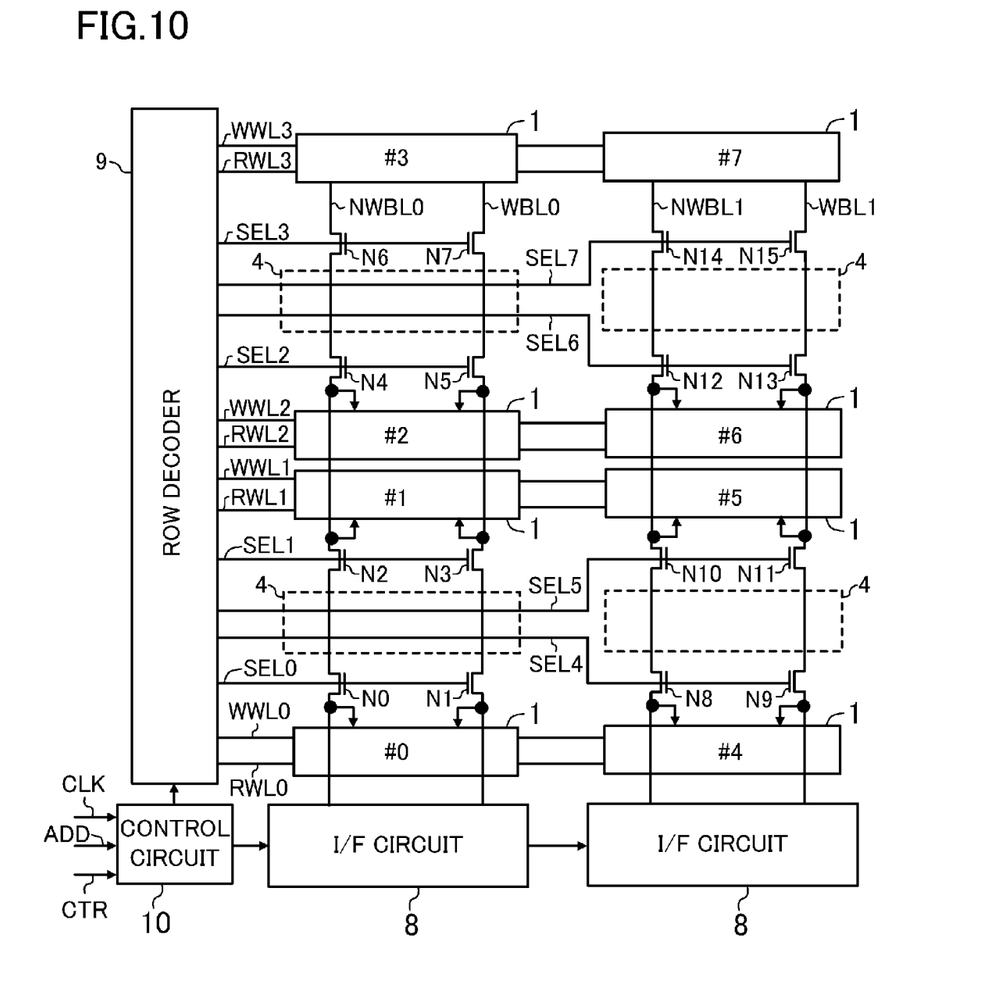
FIG. 10 is a block diagram showing a main configuration of a semiconductor memory device according to a second embodiment of the present disclosure.

A semiconductor memory device according to a second embodiment of the present disclosure will be described with reference to a block diagram shown in FIG. 10. The semiconductor memory device of FIG. 10 is the same as that shown in the block diagram of FIG. 1, except that N-channel transfer gates N0, N1, N2, N3, N4, N5, N6, N7, N8, N9, N10, N11, N12, N13, N14, and N15 are added to the pair of write bit lines WBL0 and NWBL0 and the pair of write bit lines WBL1 and NWBL1, and the semiconductor memory device has a function of controlling switch operation based on write control selection signals SEL0, SEL1, SEL2, SEL3, SEL4, SEL5, SEL6, and SEL7.

Figure 11:
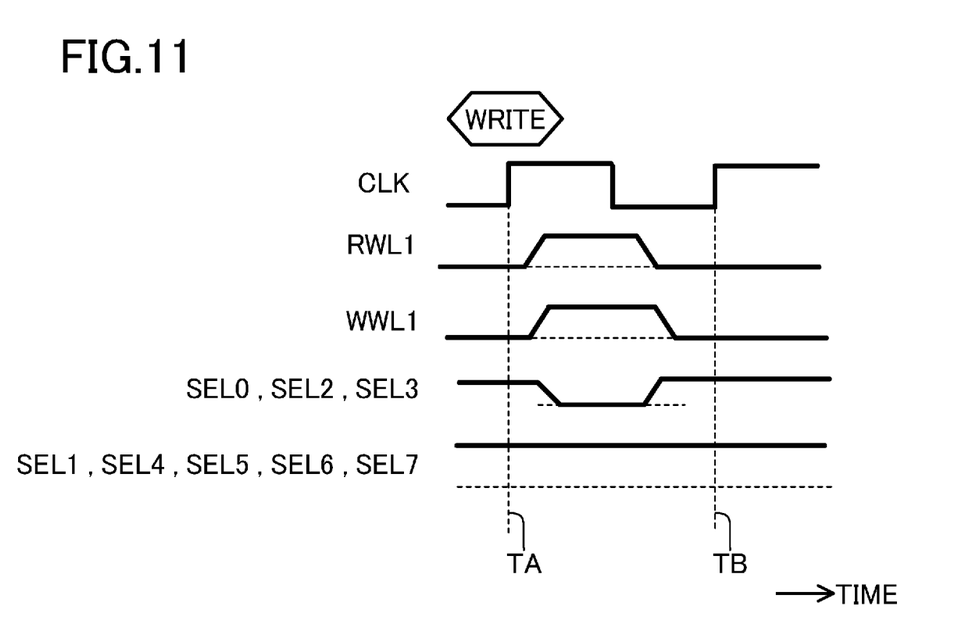
FIG. 11 is a timing chart showing main operation of the semiconductor memory device of the second embodiment of the present disclosure.

Select operation during write operation of the semiconductor memory device thus configured will be described with reference to a timing chart shown in FIG. 11. Note that it is assumed that write operation is completed in one cycle from time TA to time TB of the clock signal CLK.

Write operation is started by input of a write command at time TA. The write word line WWL1 and the read word line RWL1 corresponding to the selected address are activated. The memory cell 1 to be written is a cell #5, and therefore, the non-selected memory cell is a cell #1, and the precharge potential reset operation of the first embodiment of the present disclosure is performed. At this time, of selection signals SEL0-SEL3 connected to the N-channel transfer gates N0-N7, only an output signal which has the same address as that of the non-selected pair of write bit lines WBL0 and NWBL0 and is located in the boundary region of the memory cell array including the selected memory cell 1 is activated (i.e., the write control selection signal SEL1 is maintained active) while the other write control selection signals SEL0, SEL2, and SEL3 are inactive. The pair of write bit lines WBL1 and NWBL1 connected to the selected cell #5 needs to transfer input data to the cell #5, and therefore, the write control selection signals SEL4, SEL5, SEL6, and SEL7 which are used to control all of the N-channel transfer gates N8-N15 connected to the pair of write bit lines WBL1 and NWBL1 are maintained active, and write operation is performed.

As described above, only SEL1 of the write control selection signals SEL0-SEL3 is activated, and therefore, the interconnect load of the pair of write bit lines WBL0 and NWBL0 connected to the cell #1 can be reduced compared to the normal case. Therefore, external load noise which interferes with the data storing capability of the memory cell 1 can be reduced, whereby the SNM of the memory cell 1 can be effectively improved. Because the interconnect load of the pair of write bit lines WBL0 and NWBL0 is low, even if the transistor performance of the first and second precharge potential resetting circuits 14 and 15 used in the precharge potential reset operation is reduced, precharge potential reset operation can be performed at high speed, resulting in a higher-speed and smaller-area semiconductor memory device.

In the above example, control is performed so that only the N-channel transfer gates N2 and N3 connected to the pair of write bit lines WBL0 and NWBL0 are maintained active. Alternatively, for example, of course, the N-channel transfer gates N4 and N5 may also be maintained active, i.e., the complexity of an interconnect control is reduced although the interconnect load slightly increases compared to the above example, whereby the circuit area may be reduced.

The N-channel transfer gates N8-N15 provided for the pair of write bit lines WBL1 and NWBL1 are maintained active in the above control. Alternatively, as in the control of the N-channel transfer gates N0-N7 connected to the pair of write bit lines WBL0 and NWBL0, write operation may be performed using the write buffer provided in the local amplifier circuit 4 or the first and second precharge potential resetting circuits 14 and 15. In this case, of course, the interconnect load during write operation can be reduced, and the influence of the N-channel transfer gates N0-N15 which are load during write operation from the circuit 8 can be reduced, resulting in higher-speed write operation. In particular, by providing the control in which the first and second precharge potential resetting circuits 14 and 15 also serve as a write buffer, the write buffer 6 in the I/F circuit 8 can be removed, whereby the area can be effectively reduced.

Note that by combining this embodiment with the first embodiment or the variations, more effective advantages can, of course, be expected.

The semiconductor memory device of the present disclosure particularly has a technique of operating miniaturized memory cells stably and at higher speed, and is useful, for example, for a system LSI circuit including a large number of various memory devices.

What is claimed is:

1. A semiconductor memory device comprising:
a memory cell including a data storing circuit configured to store data by a first and a second circuit element, and a circuit including transistors provided to connect the data storing circuit, and a read bit line and a pair of write bit lines, together;
a data amplifier connected to the read bit line; and
pull-down transistors each connected to a corresponding one of the pair of write bit lines,
wherein
an output of the data amplifier is connected to the gate electrode of one of the pull-down transistors, and one of the pair of write bit lines is connected to the gate electrode of the other one of the pull-down transistors.

2. The semiconductor memory device of claim 1, wherein the transistor size of the pull-down transistor to which the output of the data amplifier is connected is larger than that of the pull-down transistor connected to the one of the pair of write bit lines.

3. The semiconductor memory device of claim 2, further comprising:
N-channel transistors each connected in series between a corresponding one of the pull-down transistors and a corresponding one of the pair of write bit lines, wherein the gate electrodes of the N-channel transistors are connected to an output signal of a write control circuit.

4. The semiconductor memory device of claim 2, wherein a source line of each of the pull-down transistors is connected to a signal line other than a power supply line.

5. The semiconductor memory device of claim 4, wherein the signal line is a signal line from a control circuit provided in a row decoder.

6. The semiconductor memory device of claim 3, wherein the output signal of the write control circuit is arranged in the same direction in which read and write word lines are arranged in the memory cell.

7. The semiconductor memory device of claim 3, wherein the output signal of the write control circuit is used to activate only a signal which is used to select the same address as that of the non-selected pair of write bit lines during write operation.

8. The semiconductor memory device of claim 3, wherein the N-channel transistor and the pull-down transistor connected together in series have the same transistor size.

9. The semiconductor memory device of claim 2, wherein the transistor size of the pull-down transistor is smaller than the buffer size of a write buffer connected to the pair of write bit lines.

10. The semiconductor memory device of claim 2, wherein two P-channel transistors are connected to the pair of write bit lines with each of the gate electrodes thereof being connected to one of the pair of write bit lines respectively, the sources thereof being connected to a power supply voltage, and each of the drains thereof being connected to the other one of the pair of write bit lines respectively.

11. The semiconductor memory device of claim 1, further comprising:
a write buffer configured to have a write buffer function of transferring input data to the pair of write bit lines, and a write-back function of transferring the output of the data amplifier to the pair of write bit lines.

12. The semiconductor memory device of claim 11, wherein
a size of the pull-down transistor is smaller than that of an N-channel transistor included in the write buffer.

13. The semiconductor memory device of claim 11, wherein
the write-back function is activated after one of the pull-down transistors is activated.

14. The semiconductor memory device of claim 3, wherein the control circuit including the pull-down transistors and the N-channel transistor is provided in the same region in which the data amplifier is provided, and the region is one or more boundary regions between memory arrays which are provided in the memory arrays.

15. The semiconductor memory device of claim 14, further comprising:
an N-channel transfer gate provided in the boundary region and arranged to connect the memory arrays, wherein the gate electrode of the N-channel transfer gate is connected to a selection signal from the write control circuit.

16. The semiconductor memory device of claim 15, wherein
an output signal connected to the N-channel transfer gate is used to activate only an output signal which is provided in the boundary region of the memory cell array including the selected memory cell having the same address as that of the non-selected pair of write bit lines.

17. The semiconductor memory device of claim 3, wherein the output signal of the write control circuit is used to activate an address signal indicating the pair of write bit lines for which write operation is masked.

\* \* \* \* \*